(12) United States Patent
Yoon et al.

(10) Patent No.: US 9,536,860 B2
(45) Date of Patent: Jan. 3, 2017

(54) STRETCHABLE DISPLAY

(71) Applicant: Samsung Display Co., Ltd., Yongin-si, Gyeonggi-do (KR)

(72) Inventors: Hyoyul Yoon, Seoul (KR); Mansik Myeong, Seoul (KR); Eunhye Kang, Hwaseong-si (KR); Mingu Kim, Seoul (KR); Heegon Kim, Seoul (KR); Dongjin Park, Seoul (KR); Jaiku Shin, Hwaseong-si (KR); Sungsik Yun, Suwon-si (KR); Sungchul Choi, Seoul (KR); Wonil Choi, Ansan-si (KR); Jongho Hong, Yongin-si (KR); Taekyoung Hwang, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/053,174

(22) Filed: Feb. 25, 2016

(65) Prior Publication Data
US 2016/0293571 A1 Oct. 6, 2016

(30) Foreign Application Priority Data
Apr. 1, 2015 (KR) .................. 10-2015-0046342

(51) Int. Cl.
*H01L 31/0203* (2014.01)
*G06F 3/041* (2006.01)
(Continued)

(52) U.S. Cl.
CPC ......... *H01L 25/048* (2013.01); *H01L 51/0097* (2013.01); *H01L 51/52* (2013.01); *H01L 2251/5338* (2013.01)

(58) Field of Classification Search
CPC ............. H01L 2924/00; H01L 51/0097; H01L 2251/5338; H01L 23/4985; H01L 23/5387; H05K 1/0283; H05K 2201/0133; H05K 1/118; B32B 2457/08; B32B 37/185; B32B 3/266; G09G 2380/02
(Continued)

(56) References Cited

U.S. PATENT DOCUMENTS 7,491,892 B2 2/2009 Wagner et al.
8,084,117 B2 * 12/2011 Lalvani .................. B32B 3/266
428/135

(Continued)

FOREIGN PATENT DOCUMENTS

KR 10-0990023 B1 10/2010
KR 10-2013-0033340 A 4/2013

*Primary Examiner* — David Vu
*Assistant Examiner* — Jonathan Han
(74) *Attorney, Agent, or Firm* — Knobbe, Martens, Olson & Bear, LLP

(57) ABSTRACT

A stretchable display is disclosed. In one aspect, the stretchable display includes a plurality of pixel substrates arranged in a matrix having row and column directions. Each of the pixel substrates includes an island and a flexible hinge connecting the island to at least one of the adjacent pixel substrates. The island of each of the pixel substrates includes a plurality of first sides and a plurality of second sides. The flexible hinge of each of the pixel substrates includes a plurality of first flexible sub-hinges respectively extending from the first sides in the row direction and a plurality of second flexible sub-hinges respectively extending from the second sides in the column direction.

20 Claims, 8 Drawing Sheets

(51) Int. Cl.
*H01L 25/04* (2014.01)
*H01L 51/00* (2006.01)
*H01L 51/52* (2006.01)

(58) Field of Classification Search
USPC ... 174/254; 257/E23.177, E25.012; 361/749, 776, 789; 428/136
See application file for complete search history.

(56) References Cited

U.S. PATENT DOCUMENTS

| | | |
|---|---|---|
| 8,207,473 B2 | 6/2012 | Axisa et al. |
| 8,883,287 B2 | 11/2014 | Boyce et al. |
| 9,040,337 B2 | 5/2015 | Park et al. |
| 2002/0094701 A1* | 7/2002 | Biegelsen .............. B25J 13/084 439/32 |
| 2004/0192082 A1* | 9/2004 | Wagner ................ H05K 1/0283 439/67 |
| 2010/0330338 A1* | 12/2010 | Boyce .................... B29C 59/02 428/156 |
| 2014/0144480 A1 | 5/2014 | Lee |
| 2014/0299362 A1* | 10/2014 | Park .................... H05K 1/0283 174/254 |

\* cited by examiner

STRETCHABLE DISPLAY

CROSS-REFERENCE TO RELATED APPLICATION

This U.S. non-provisional patent application claims priority under 35 U.S.C. §119 of Korean Patent Application No. 10-2015-0046342, filed on Apr. 1, 2015, the entire contents of which are hereby incorporated by reference.

BACKGROUND

1. Field

The present disclosure generally relates to a stretchable display capable of being easily stretched.

2. Description of the Related Technology

With the recent development of display technologies, a number of flexible displays capable of being folded or bent and stretchable displays having elasticity in at least one direction are undergoing active development. These display devices can be altered in shape to a predetermined configuration or to various configurations upon user demand.

One type of flexible display is an elastic display which can maintain its electrical connections/functionality even when the display is stretched by an external force. Elastic displays include a stretchable device capable of being stretched or contracted.

SUMMARY OF CERTAIN INVENTIVE ASPECTS

One inventive aspect is a stretchable device capable of being easily stretched.

Another aspect is a stretchable device including pixel substrates arranged in a matrix along row and column directions, wherein each of the pixel substrates comprises an island and a flexible hinge configured to connect the island and adjacent pixel substrates among the pixel substrates, and the island of each of the pixel substrates comprises a plurality of sides which are not parallel to the row and column directions, and the flexible hinge of each of the pixel substrate comprises: a plurality of first flexible sub-hinges respectively extending from first sides of the sides in a direction parallel to the row direction; and a plurality of second flexible sub-hinges respectively extending from second sides of the sides in a direction parallel to the column direction.

In an embodiment, the pixel substrate can include: a first island line formed on the island in parallel with the second sides; and a second island line formed on the island in parallel with the first sides, wherein the first island line has at least one end that overlaps the first sides, and the second island line has at least one end that overlaps the second sides.

In an embodiment, each of the first subs flexible hinges comprises a first connecting rod parallel to the row direction and having a shape which is not bent, and each of the second flexible sub-hinges comprises a second connecting rod parallel to the column direction and having a shape which is not bent, and the each of the pixel substrate comprises: a first connecting line connected to the first island line and formed on the first connecting rod; and a second connecting line connected to the second island line and formed on the second connecting rod.

In an embodiment, the first flexible sub-hinge can include a first fan-out part interposed between the first connecting rods and the island, and the second flexible sub-hinge can include a second fan-out part interposed between the second connecting rod and the island, and the each of the pixel substrate can include: a first fan-out line configured to connect the first connecting line to the first island line and formed on the first fan-out part; and a second fan-out line configured to connect the second connecting line to the second island line and formed on the second fan-out part.

In an embodiment, the first connecting rod can include first and second connecting areas by which the first connecting rod is divided in the column direction, and the first connecting line can be formed only on the first connecting area.

In an embodiment, strain in the first connecting area can be less than that in the second connecting area.

In an embodiment, the second connecting area can be defined between a first center line and the first connecting area, and the first center line can pass through a center of the island in parallel with the row direction.

In an embodiment, the first connecting rod can include first and second edges respectively belong to the first and second connected area, and the first fan-out part can include a strain alleviating groove connected to the second edge to alleviate stress in the first connecting rod.

In an embodiment, the strain alleviating groove can be recessed in parallel with the second side.

In an embodiment, the second connecting rod can include third and fourth connecting areas by which the second connecting rod is divided in the row direction, and the second connecting line can be formed only on the third connecting area.

In an embodiment, strain in the third connecting area can be less than that in the fourth connecting area.

In an embodiment, the fourth connecting area can be defined between a second center line and the third connecting area, and the second center line can pass through a center of the island in parallel with the column direction.

In an embodiment, a strain value of each of the first and third connecting area can be less than about 1%.

In an embodiment, an angle formed by the first side and the first connecting rod can be about 45°, and an angle formed by the second side and the second connecting rod can be about 225°.

In an embodiment, the stretchable device can further include at least one light emitting device formed on the island of the pixel substrate.

In an embodiment, the at least one light emitting device can be connected to the first island line and the second island line.

In an embodiment, the first island line can be a gate line that receives a gate signal, and the second island line can be a data line that receives a data signal.

In an embodiment, the pixel substrate comprises first and second pixel substrates alternately arranged along the row and column directions, and an angle formed by a first side of the first pixel substrate and first connecting rod of each of the first flexible sub-hinges of the first pixel substrate and an angle formed by a second side of the first pixel substrate and second connecting rod of each of the second flexible sub-hinges of the second pixel substrate are defined as a first angle, and an angle formed by a first side of the second pixel substrate and the first connecting rod of the first flexible sub-hinge of the second pixel substrate and an angle formed by a second side of the second pixel substrate and the second connecting rod of the second flexible sub-hinge of the second pixel substrate are defined as a second angle that is different from the first angle.

In an embodiment, the first angle can be about 45°, and the second angle can be about 225°.

In an embodiment, the pixel substrate can include first to third pixel substrates, and the second pixel substrate and the first pixel substrate can have symmetric shapes with respect to a first virtual line passing between the first and second pixel substrates in parallel with the column direction, and the third pixel substrate and the first pixel substrate can have symmetric shapes with respect to a second virtual line passing between the first and third pixel substrates in parallel with the row direction.

Another aspect is a stretchable device comprising pixel substrates arranged in a matrix along row and column directions, and wherein each of the pixel substrates comprises an island and a flexible hinge configured to connect the island and adjacent pixel substrates among the pixel substrates to each other, and the island of the pixel substrate comprises a plurality of sides parallel to the row and column directions, and the flexible hinge of the pixel substrate comprises: a plurality of first flexible sub-hinges respectively extending from first sides of the sides in a direction parallel to the row direction; and a plurality of second flexible sub-hinges respectively extending from second sides of the sides in a direction parallel to the column direction.

Another aspect is a stretchable display, comprising a plurality of pixel substrates arranged in a matrix having row and column directions, wherein each of the pixel substrates comprises an island and a flexible hinge connecting the island to at least one of the adjacent pixel substrates, wherein the island of each of the pixel substrates comprises a plurality of first sides and a plurality of second sides, wherein each of the first and second sides is not parallel to the row and column directions, and wherein the flexible hinge of each of the pixel substrates comprises: a plurality of first flexible sub-hinges respectively extending from the first sides in the row direction; and a plurality of second flexible sub-hinges respectively extending from the second sides in the column direction.

In exemplary embodiments, the pixel substrate comprises a first island line formed over the island parallel with the second sides; and a second island line formed over the island parallel with the first sides, wherein the first island line has a first end that overlaps a corresponding one of the first sides, and the second island line has a first end that overlaps a corresponding one of the second sides.

In exemplary embodiments, each of the first flexible sub-hinges comprises a first connecting rod parallel to the row direction and having a shape which is not bent, each of the second flexible sub-hinges comprises a second connecting rod parallel to the column direction and having a shape which is not bent, and each of the pixel substrates further comprises a first connecting line connected to the first island line and formed on the first connecting rod; and a second connecting line connected to the second island line and formed on the second connecting rod.

In exemplary embodiments, each of the first flexible sub-hinges comprises a first fan-out portion interposed between the corresponding first connecting rod and the island, each of the second flexible sub-hinges comprises a second fan-out portion interposed between the corresponding second connecting rod and the island, and each of the pixel substrates further comprises: a first fan-out line connecting the first connecting line to the first island line and formed on the first fan-out part; and a second fan-out line connecting the second connecting line to the second island line and formed on the second fan-out part.

In exemplary embodiments, each of the first connecting rods is divided into first and second connecting areas in the column direction, and the first connecting line is formed only on the first connecting area.

In exemplary embodiments, when the stretchable display is stretched, strain in the first connecting area is less than that in the second connecting area.

In exemplary embodiments, the second connecting area is defined between a first center line and the first connecting area, and wherein the first center line passes through a center of the island and is parallel with the row direction.

In exemplary embodiments, the first connecting rod comprises first and second edges respectively belonging to the first and second connected areas and the first fan-out portion comprises a strain alleviating groove connected to the second edge and configured to alleviate stress in the first connecting rod.

In exemplary embodiments, the strain alleviating groove is recessed parallel with the second side.

In exemplary embodiments, each of the second connecting rods is divided into third and fourth connecting areas in the row direction, and the second connecting line is formed only on the third connecting area.

In exemplary embodiments, when the stretchable display is stretched, strain in the third connecting area is less than that in the fourth connecting area.

In exemplary embodiments, the fourth connecting area is defined between a second center line and the third connecting area and the second center line passes through a center of the island and is parallel with the column direction.

In exemplary embodiments, when the stretchable display is bent, a strain value of each of the first and third connecting area is less than about 1%.

In exemplary embodiments, an angle formed between the first side and the first connecting rod is about 45° and an angle formed between the second side and the second connecting rod is about 225°.

In exemplary embodiments, the stretchable display further comprises at least one light emitting element formed on the island of the pixel substrate.

In exemplary embodiments, the at least one light emitting element is connected to the first island line and the second island line.

In exemplary embodiments, the pixel substrates comprises first and second pixel substrates alternately arranged in the row and column directions, an angle formed between a first side of the first pixel substrate and first connecting rod of each of the first flexible sub-hinges of the first pixel substrate and an angle formed between a second side of the first pixel substrate and second connecting rod of each of the second flexible sub-hinges of the first pixel substrate are defined as a first angle, and an angle formed between a first side of the second pixel substrate and the first connecting rod of the first flexible sub-hinge of the second pixel substrate and an angle formed between a second side of the second pixel substrate and the second connecting rod of the second flexible sub-hinge of the second pixel substrate are defined as a second angle that is different from the first angle.

In exemplary embodiments, the first angle is about 45°, and wherein the second angle is about 225°.

In exemplary embodiments, the pixel substrates comprises first to third pixel substrates, the second pixel substrate and the first pixel substrate have symmetric shapes with respect to a first virtual line passing between the first and second pixel substrates parallel with the column direction, and the third pixel substrate and the first pixel substrate have symmetric shapes with respect to a second virtual line passing between the first and third pixel substrates parallel with the row direction.

Another aspect is a stretchable display, comprising a plurality of pixel substrates arranged in a matrix having row and column directions, wherein each of the pixel substrates comprises an island and a flexible hinge connecting the island to at least one of the adjacent pixel substrates, wherein the island of each of the pixel substrates comprises a plurality of first sides and a plurality of second sides respectively parallel to the row and column directions, and wherein the flexible hinge of each of the pixel substrates comprises: a plurality of first flexible sub-hinges respectively extending from the first sides in the row direction; and a plurality of second flexible sub-hinges respectively extending from the second sides in the column direction.

BRIEF DESCRIPTION OF THE DRAWINGS

The accompanying drawings are included to provide a further understanding of the described technology and are incorporated in and constitute a part of this specification. The drawings illustrate exemplary embodiments and, together with the description, serve to explain principles of the described technology.

DETAILED DESCRIPTION OF CERTAIN INVENTIVE EMBODIMENTS

Figure 1:
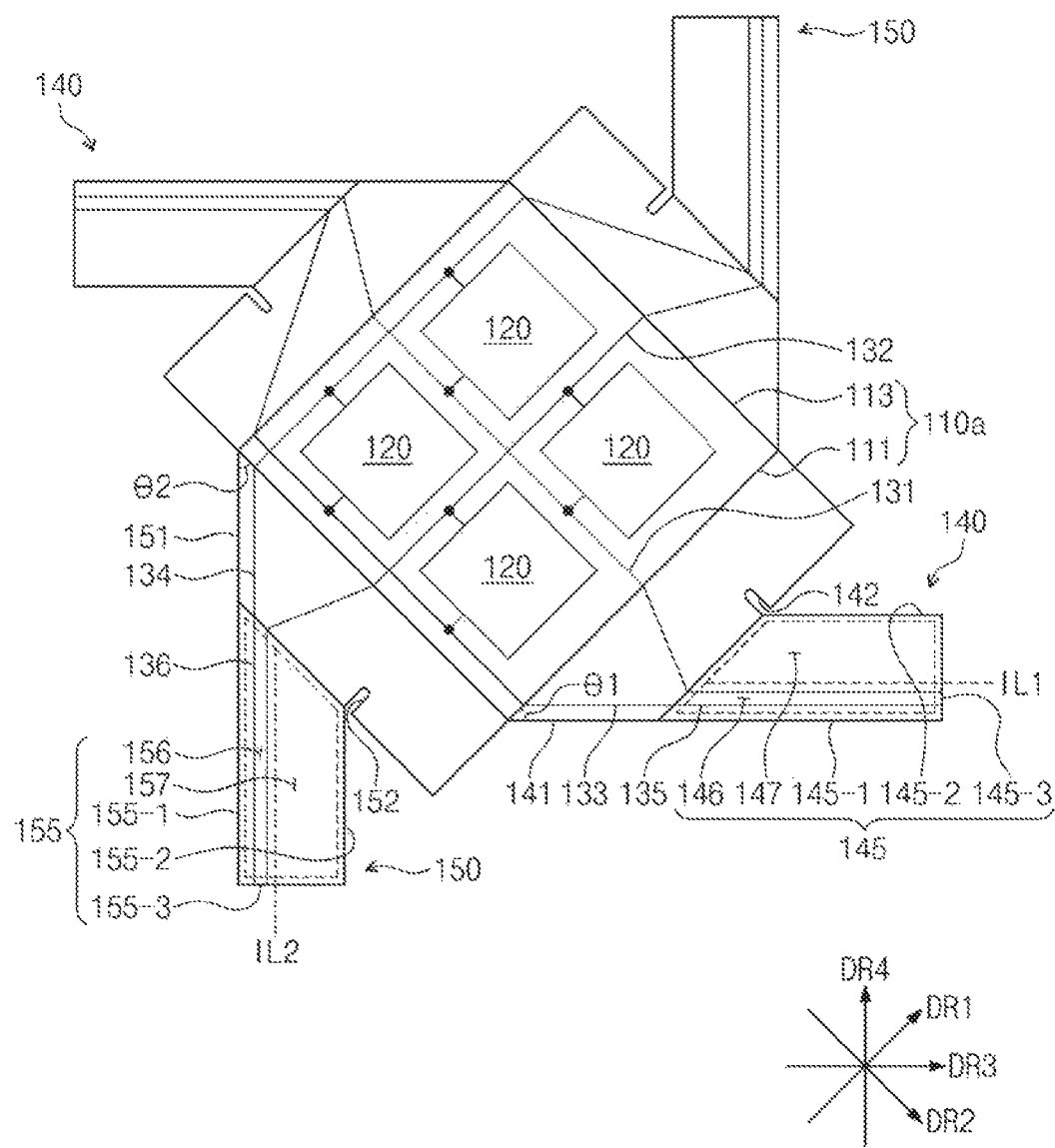
FIG. 1 is a plan view of a pixel substrate according to an embodiment.

Advantages and features of the described technology and implementation methods thereof will be clarified through following embodiments described with reference to the accompanying drawings. The described technology may, however, be embodied in different forms and should not be construed as limited to the embodiments set forth herein. Rather, these embodiments are provided so that this disclosure will be thorough and complete, and will fully convey the scope of the described technology to those skilled in the art. Further, the described technology is only defined by scopes of claims. Like reference numerals refer to like elements throughout.

It will be understood that when an element such as a layer is referred to as being "on" another element, it can be directly on the other element or intervening elements can also be present. On the other hand, it will be understood that when an element such as a layer is referred to as being "directly on" another element, it can be directly on the other element without any intervening elements therebetween. The term "and/or" includes any and all combinations of one or more of the associated listed items.

In the description of embodiments, "below", "beneath", "lower", "above", and "upper" that are the terms used for describing the spatial relationship between various elements may be used to easily explain these relationships between one element or constitutions and other element or constitutions. It should be understood that the terms used for described spatial relationships are terms that include other directions of the element when it is used or driven in addition to a direction illustrated in the drawing.

Also, though terms such as "first" and "second" are used to describe and distinguish between various elements, components, and/or sections in various embodiments of the described technology, the elements, components, and/or sections are not limited to these terms. These terms are used only to differentiate one element, component, or section from another one. Thus, a first element, a first component, or a first section described below may be termed a second element, a second component, or a second section without departure from the scope of the described technology.

Additionally, the embodiments described in the detailed description will be described with sectional views as ideal exemplary views of the described technology. Therefore, the embodiments are not limited to the specific shape(s) illustrated in the exemplary views, but can include other shapes that can be created according to, for example, manufacturing processes. Areas exemplified in the drawings have general properties, and are used to illustrate a specific shape of a semiconductor package region. Thus, this should not be construed as limiting of the scope of the described technology.

Hereinafter, exemplary embodiments will be described in detail with reference to the accompanying drawings.

FIG. 1 is a plan view of a pixel substrate according to an embodiment. The configuration has a generally pinwheel shape.

Referring to FIG. 1, a first pixel substrate 101a includes an island 110a and a flexible hinge.

The island 110a includes a plurality of sides. In an embodiment, the island 110a includes a plurality of first sides 111 and a plurality of second sides 113. The first sides 111 are parallel to a first direction DR1, and the second sides 113 are parallel to a second direction DR2. For example, the island 110a can have a square shape including the first and second sides 111 and 113. The first and second directions DR1 and DR2 can cross each other at right angles.

For example, the island 110a can be formed of polyester such as polyethylene terephthalate, polybutylene phthalate, and polyethylene naphthalate. Also, the island 110a can be formed of polymer such as polystyrene, polycarbonate, polyether sulfone, polyarylate, polyimide, polycycloolefin, norbornene resin, poly(chlorotrifluoroethylene), and polymethyl methacrylate.

The first pixel substrate 101a can further include a plurality of light emitting devices 120, a plurality of first island lines 131, and a plurality of second island lines 132. Also, as described later, the first pixel substrate 101a can further include a plurality of first fan-out lines 133, a plurality of second fan-out lines 134, a plurality of first connecting lines 135, and a plurality of second connecting lines 136.

The first island lines 131 can be parallel to the second direction DR2 and arranged to be spaced a predetermined distance apart from each other in the first direction DR1. Each of the first island lines 131 has one end that overlaps each of the first sides 111. The second island lines 132 can be parallel to the first direction DR1 and arranged to be spaced a predetermined distance apart from each other in the second direction DR2. Each of the second island lines 132 has one end that overlaps each of the second sides 113. The first and second island lines 131 and 132 are insulated from each other and cross each other at right angles.

The light emitting devices 120 are formed on pixel areas defined by the first and second island lines 131 and 132. More particularly, the light emitting devices 120 are arranged in a matrix in the first and second directions DR1 and DR2. In an embodiment, the light emitting devices 120 are arranged in a 2 (row)×2 (column) matrix. However, the described technology is not limited thereto, and one light emitting device 120 can be formed on one island 110a, or M×N light emitting devices 120 can be formed in an M (row)×N (column) (M and N are natural numbers greater than 2) matrix.

The light emitting devices 120 are respectively connected to the first and second island lines 131 and 132. In one embodiment, the first island lines 131 can be gate lines providing gate signals to the light emitting devices 120, and the second island lines 132 can be data lines providing data signals to the light emitting devices 120.

For example, the light emitting devices 120 can include an organic light-emitting diode (OLED). However, described technology is not limited thereto, and the light emitting devices 120 can include an inorganic light-emitting diode (LED), an electro wetting display device, or an electrophoretic display device.

The flexible hinge includes a plurality of first flexible sub-hinges 140 and a plurality of second flexible sub-hinges 150. In an embodiment, the number of first flexible sub-hinges 140 is two, and the first flexible sub-hinges 140 respectively correspond to the two first sides 111. Similarly, in this embodiment, the number of second flexible sub-hinges 150 is two, and the second flexible sub-hinges 150 respectively correspond to the two second sides 113.

Each of the first flexible sub-hinges 140 includes a first fan-out part or first fan-out portion 141 and a first connecting rod 145. The first fan-out part 141 and the first connecting rod 145 can be formed of polymer such as polyethylene terephthalate like the island 110a.

The first fan-out part 141 is interposed between the first connecting rod 145 and the island 110a. In FIG. 1, the island 110a, the first fan-out part 141, and the first connecting rod 145 can be separately provided. However, described technology is not limited thereto, and the first fan-out part 141 can extend from the island 110a, and the first connecting rod 145 can extend from the first fan-out part 141.

The first fan-out lines 133 are formed on the first fan-out part 141. Each of the first fan-out lines 133 has one end that is electrically connected to one end of each of the first island lines 131. The distances between the first fan-out lines 133 gradually decrease from one end of the first fan-out lines 133 toward the other end of the first fan-out lines 133.

The first connecting rod 145 has a rod shape extending in one direction. More particularly, the first connecting rod 145 has a shape that is not bent. As described later, since the first connecting rod 145 has a rod shape, a phenomenon in which a large strain is generated in a longitudinal direction of the first connecting rod 145 can be prevented.

The first connecting rod 145 extends from the first fan-out part 141 in a direction parallel to the third direction DR3. In one embodiment, the third direction DR3 is not parallel to the first and second directions DR1 and DR2. For example, the angles between the third direction DR3 and the first and second directions DR1 and DR2 can be about 45°.

The first connecting rod 145 can include first and second connecting areas 146 and 147. The first and second connecting areas 146 and 147 divide the first connecting rod 145 in a fourth direction DR4 perpendicular to the third direction DR3. The second connecting area 147 is defined between a first center line (not shown) and the first connecting area 146. The first center line crosses a center of the island 110a and is parallel to the row direction, that is, the third direction DR3.

The first connecting rod 145 includes a first edge 145-1, a second edge 145-2, and a first connection edge 145-3. The first and second edges 145-1 and 145-2 can extend in a direction parallel to the third direction DR3 to face each other. The first connection edge 145-3 can connect the first edge 145-1 to the second edge 145-2. Also, the first connection edge 145-3 can extend in the fourth direction DR4 perpendicular to the third direction DR3.

The first and second edges 145-1 and 145-2 respectively belong to the first and second connecting areas 146 and 147. Also, an area between a first virtual line IL1 passing through the first connecting rod 145 parallel with the third direction DR3 and the first edge 145-1 corresponds to the first connecting area 146. Further, an area between the first virtual line IL1 and the second edge 145-2 corresponds to the second connecting area 147.

The first connecting rod 145 forms a first angle θ1 with the corresponding first side 111. More particularly, the first angle θ1 can be defined as an angle formed by the first side 111 and the first edge 145-1. In an embodiment, the first angle θ1 can be about 45°.

The first connecting lines 135 are formed on the first connecting rod 145. The first connecting lines 135 are parallel to the third direction DR3 and arranged to be spaced a predetermined distance apart from each other in the fourth direction DR4. Each of the first connecting lines 135 has one end that is electrically connected to the other end of each of the first fan-out lines 133.

In an embodiment, the first connecting lines 135 are arranged only on the first connecting area 146. As described later, when the first connecting rod 145 is bent, the strain generated in the first connecting area 146 is less than that generated in the second connecting area 147.

The first fan-out part 141 includes a first strain alleviating groove 142. The first strain alleviating groove 142 can be recessed in a direction parallel to the second side 113. In other words, the first strain alleviating groove 142 is recessed in a direction parallel to the second direction DR2.

The first strain alleviating groove 142 is connected to the second edge 145-2. When the first connecting rod 145 is bent, the first strain alleviating groove 142 can reduce strain generated in the first connecting rod 145.

Each of the second flexible sub-hinges 150 includes a second fan-out part 151 and a second connecting rod 155. The second fan-out part 151 and the second connecting rod 155 can be formed of polymer such as polyethylene terephthalate like the island 110a.

The second fan-out part 151 is interposed between the second connecting rod 155 and the island 110a. In FIG. 1, the island 110a, the second fan-out part 151, and the second connecting rod 155 are separately provided. However, the described technology is not limited thereto, and the second fan-out part 151 can extend from the island 110a, and the second connecting rod 155 can extend from the second fan-out part 151.

The second fan-out lines 134 are formed on the second fan-out part 151. Each of the second fan-out lines 134 has one end that is electrically connected to the one end of each of the second island lines 132. The distances between the second fan-out lines 134 gradually decreases from one end of the second fan-out lines 134 toward the other end of the second fan-out lines 134.

The second connecting rod 155 has a rod shape extending in one direction. More particularly, the second connecting rod 155 has a shape that is not bent. As described later, since the second connecting rod 155 has a rod shape, a phenomenon in which a large strain is generated in a longitudinal direction of the second connecting rod 155 can be prevented.

The second connecting rod 155 extends from the second fan-out part 151 in a direction parallel to the fourth direction DR4.

The second connecting rod 155 can include third and fourth connecting areas 156 and 157. The third and fourth connecting areas 156 and 157 divide the second connecting rod 155 in the third direction DR3. The fourth connecting area 247 is defined between a second center line (not shown) and the third connecting area 156. The second center line crosses the center of the island 110a and is parallel to the column direction.

The second connecting rod 155 includes a third edge 155-1, a fourth edge 155-2, and a second connection edge 155-3. The third and fourth edges 155-1 and 155-2 can extend in a direction parallel to the fourth direction DR4 to face each other. The second connection edge 155-3 can connect the third edge 155-1 to the fourth edge 155-2 and extend in a direction parallel to the third direction DR3.

The third and fourth edges 155-1 and 155-2 respectively belong to the third and fourth connecting areas 156 and 157. Also, an area between a second virtual line IL2 passing through the second connecting rod 155 parallel with the fourth direction DR4 and the third edge 155-1 corresponds to the third connecting area 156. Also, an area between the second virtual line IL2 and the fourth edge 155-2 corresponds to the fourth connecting area 157.

The second connecting rod 155 forms a second angle θ2 with a second side 113, which corresponds thereto, of the second sides 113. More particularly, the second angle θ2 can be defined as an angle formed by the second side 113 and the third edge 155-1. In an embodiment, the second angle θ2 can be about 45°.

The second connecting lines 136 are formed on the second connecting rod 155. The second connecting lines 136 are parallel to the fourth direction DR4 and arranged to be spaced a predetermined distance apart from each other in the third direction DR3. Each of the second connecting lines 136 has one end that is electrically connected to an end of each of the second fan-out lines 134.

In an embodiment, the second connecting lines 136 are formed only on the third connecting area 156. As described later, when the second connecting rod 155 is bent, strain generated in the third connecting area 156 is less than that generated in the fourth connecting area 157.

The second fan-out part 151 includes a second strain alleviating groove 152. The second strain alleviating groove 152 can be recessed in a direction parallel to the first side 111. In other words, the second strain alleviating groove 152 is recessed in a direction parallel to the first direction DR1. The second strain alleviating groove 152 is connected to the fourth edge 155-2. When the second connecting rod 155 is bent, the second strain alleviating groove 152 can reduce the strain generated in the second connecting rod 155.

Figure 2:
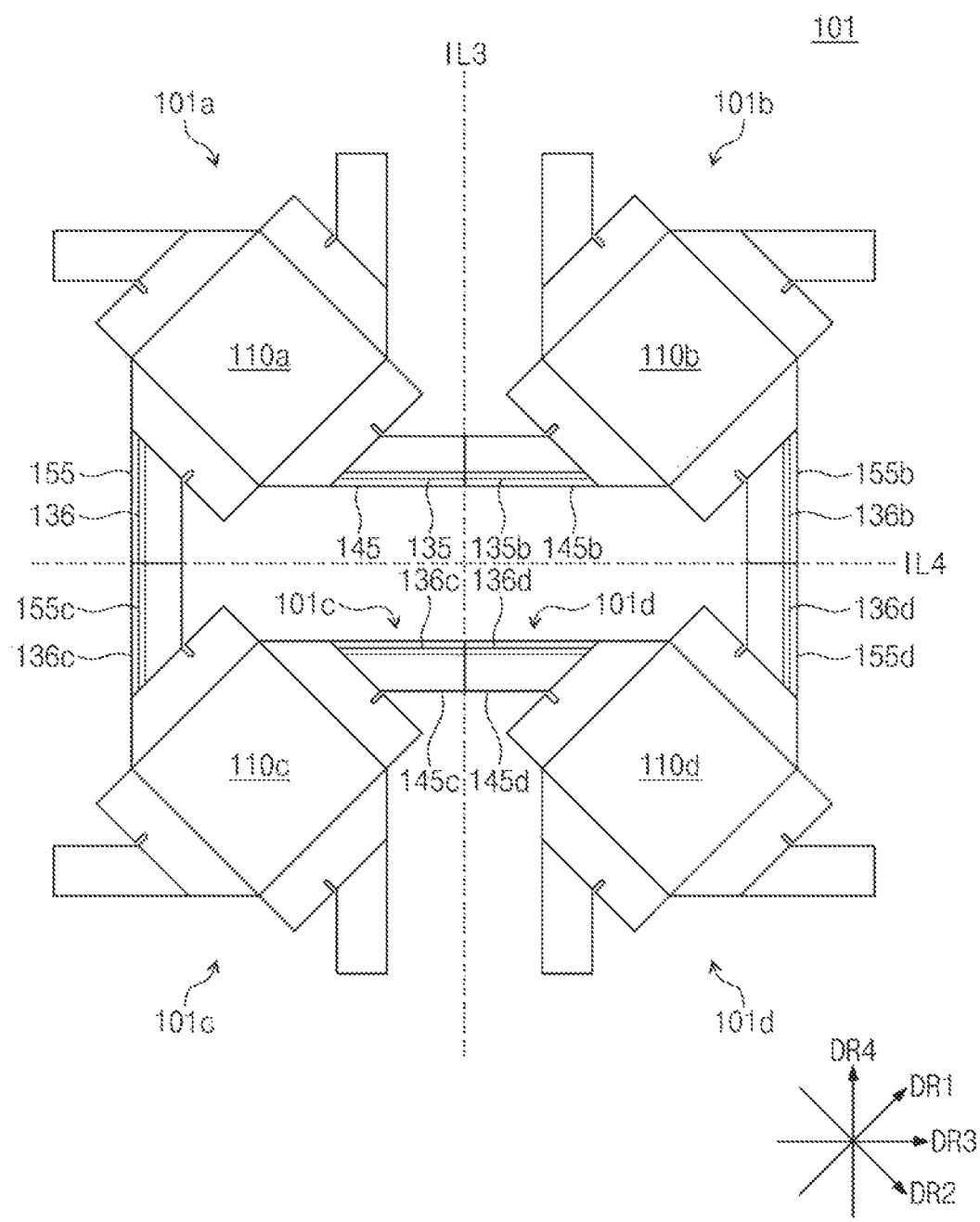
FIG. 2 is a plan view of a stretchable device according to an embodiment.

FIG. 2 is a plan view of a stretchable device or stretchable display according to an embodiment.

Referring to FIG. 2, the stretchable device 101 includes the first pixel substrate 101a and second to fourth pixel substrates 101b to 101d. The first to fourth pixel substrates 101a to 101d can form one pixel substrate unit. In FIG. 2, for convenience of description, a portion of the components are omitted.

The first to fourth pixel substrates 101a to 101d are arranged in a matrix in the third and fourth directions DR3 and DR4. The third and fourth directions DR3 and DR4 can be respectively parallel to row and column directions of the matrix. In FIG. 2, although the stretchable device 101 is includes one pixel substrate unit, the stretchable device 101 can include a plurality of pixel substrate units connected to each other.

The second pixel substrate 101b is formed by symmetrically transforming the first pixel substrate 101a with respect to a third virtual line IL3 passing through the first and second pixel substrates 101a and 101b parallel with the fourth direction DR4. Thus, the second pixel substrate 101b can include the same components as those of the first pixel substrate 101a, that is, the island 110a, the flexible hinge, and the lines 131 to 136. The second pixel substrate 101b and the first pixel substrate 101a can have symmetric shapes with respect to the third virtual line IL3.

Also, the third pixel substrate 101c is formed by symmetrically transforming the first pixel substrate 101a with respect to a fourth virtual line IL4 passing through the first and third pixel substrates 101a and 101c parallel with the third direction DR3. Thus, the third pixel substrate 101c can include the same components as those of the first pixel substrate 101a, that is, the island 110a, the flexible hinge, and the lines 131 to 136. The third pixel substrate 101c and the first pixel substrate 101a can have symmetric shapes with respect to the fourth virtual line IL4.

Also, the fourth pixel substrate 101d is formed by symmetrically transforming the third pixel substrate 101c with respect to the third virtual line IL3. Thus, the fourth pixel substrate 101d can include the same components as those of the first pixel substrate 101a, that is, the island 110a, the flexible hinge, and the lines 131 to 136. The fourth pixel substrate 101d and the third pixel substrate 101c can have symmetric shapes with respect to the third virtual line IL3.

The flexible hinges of the first to fourth pixel substrates 101a to 101d contact each other and are connected to each other. More particularly, the first and second connecting rods 145 and 155 of the first pixel substrate 101a are respectively connected to a first connecting rod 145b of the second pixel substrate 101b and a second connecting rod 155c of the third pixel substrate 101c. Similarly, first and second connecting rods 145d and 155d of the fourth pixel substrate 101d are respectively connected to a first connecting rod 145c of the third pixel substrate 101c and a second connecting rod 155b of the second pixel substrate 101b.

The connecting lines of the first to fourth pixel substrates 101a to 101d contact each other and are connected to each other. More particularly, the first and second connecting lines 135 and 136 of the first pixel substrate 101a are respectively connected to a first connecting line 135b of the second pixel substrate 101b and a second connecting line 136c of the third pixel substrate 101c. Similarly, first and second connecting lines 135d and 136d of the fourth pixel substrate 101d are respectively connected to a first connecting line 135c of the third pixel substrate 101c and a second connecting line 136b of the second pixel substrate 101b.

Accordingly, when the lines of the first to fourth pixel substrates 101a to 101d are connected to each other, light emitting devices (not shown) of the first to fourth pixel substrates 101a to 101d can be driven via gate signals and data signals.

Figure 3:
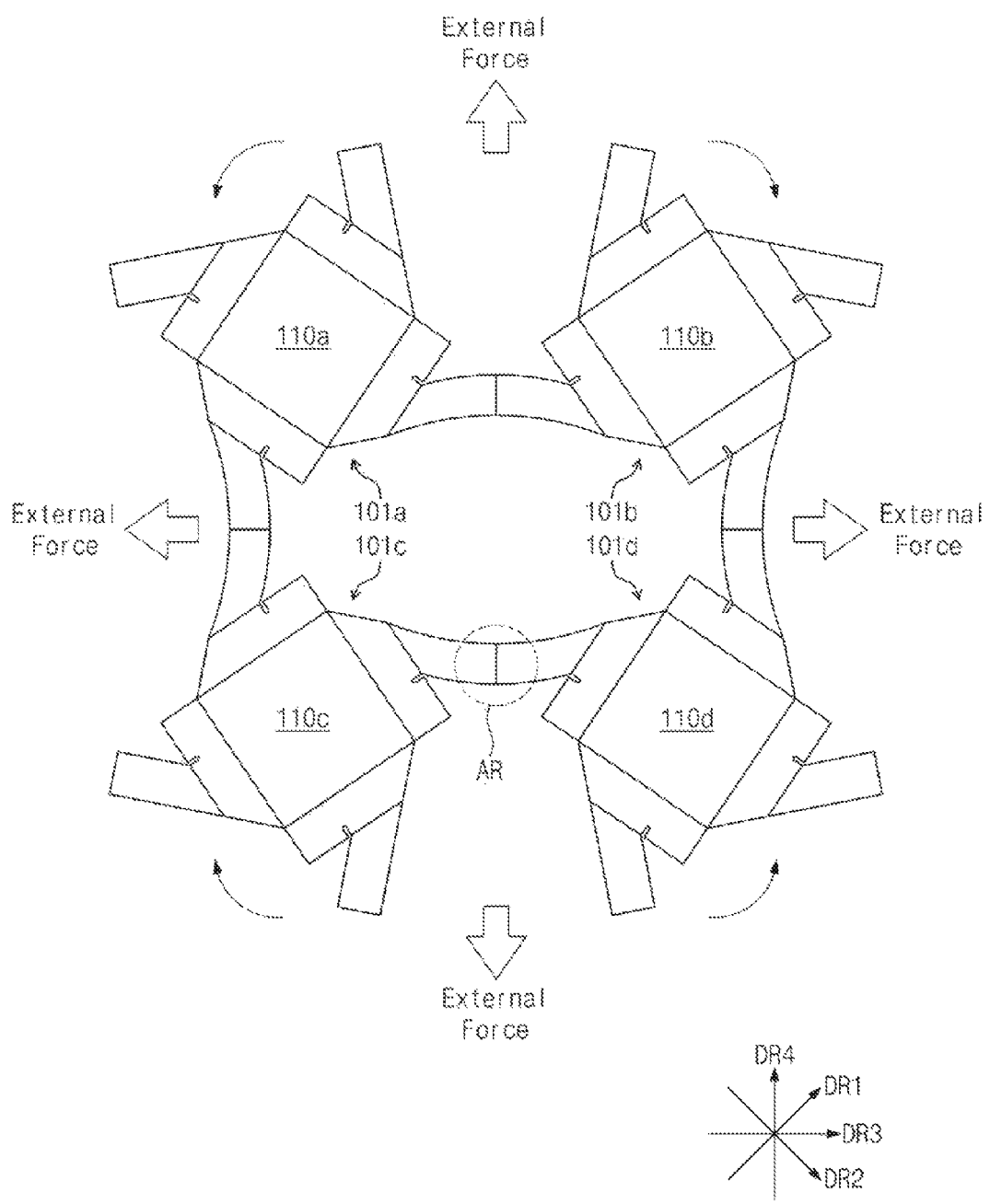
FIG. 3 is a plan view illustrating a configuration in which the stretchable device of FIG. 2 is stretched.

FIG. 3 is a plan view illustrating a configuration in which the stretchable device of FIG. 2 is stretched.

In FIG. 3, for convenience of description, a portion of the components are omitted.

Referring to FIG. 3, the stretchable device 101 is stretched according to an external force applied thereto in the third and fourth directions DR3 and DR4. More particularly, when the external force is applied in a direction in which the stretchable device 101 is stretched, the islands 110a to 110d rotate. More particularly, the island 110a and 110d of the first and fourth pixel substrates 101a and 101d rotate in a counterclockwise direction, and the islands 110b and 110c of the second and third pixel substrate 101b and 101c rotate in a clockwise direction.

As the islands 110a to 110d rotate, the first and second connecting rods of the first to fourth pixel substrates 101a to 101d are bent, and strain is generated in the first and second connecting rods of the first to fourth pixel substrates 101a to 101d.

Figure 4:
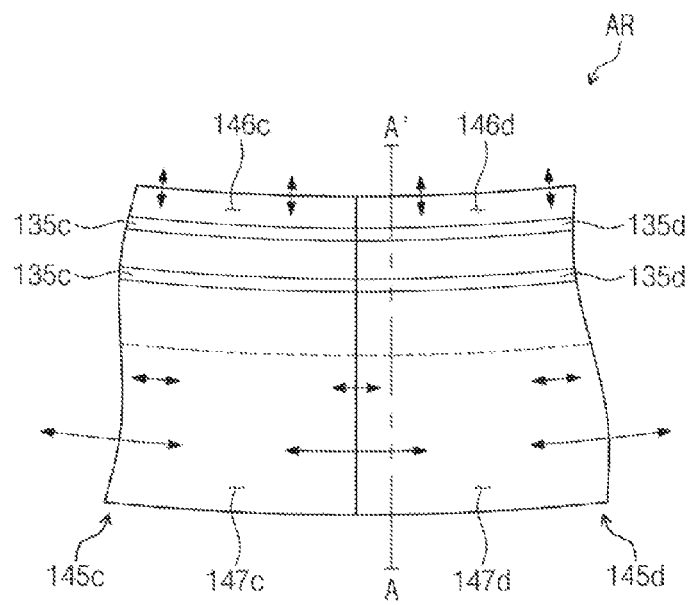
FIG. 4 is an exploded plan view of area AR of FIG. 3.
Figure 5:
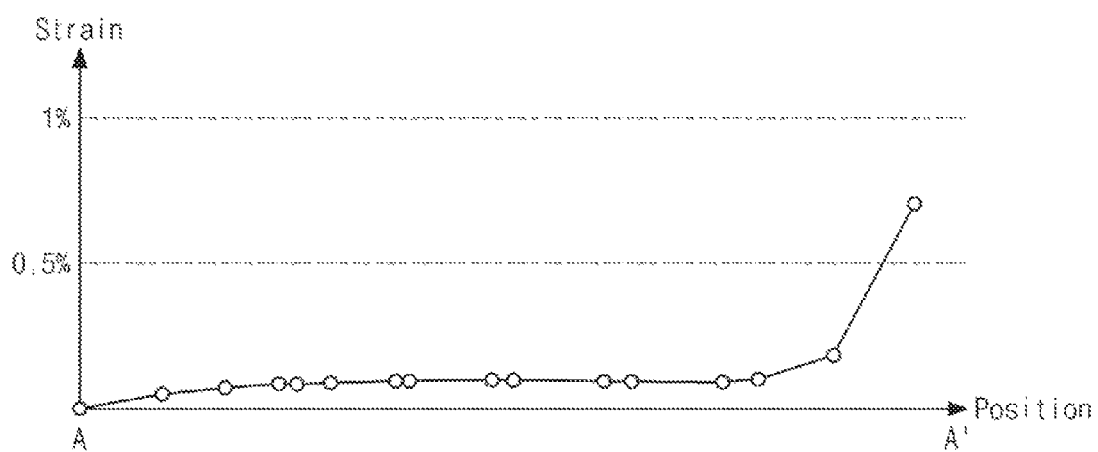
FIG. 5 is a graph showing strain of first connecting rods of FIG. 4 in a width direction.

FIG. 4 is an exploded plan view of area AR of FIG. 3. FIG. 5 is a graph showing strain of first connecting rods of FIG. 4 in a width direction.

Hereinafter, an embodiment will be described with reference to FIGS. 4 and 5. FIG. 4 is a view illustrating the intensity and direction of strain generated in the first connecting rods 145c and 145d through a simulation. In FIG. 5, the x-axis represents a position on the line A-A' extending in a width direction of the first connecting rods 145c and 145d, and the y-axis represents strain according to the positions.

As illustrated in FIG. 5, the maximum strain generated in the first connecting rod 145d of the fourth pixel substrate 101d is below about 1%. Here, the strain represents geometric deformation of a material occurring due to stress. The strain can be defined as a value in which a deformed length is divided by an original length.

In general, for a line formed of metal materials, when strain greater than about 2% is generated, a crack can be generated, and thus the line can suddenly increase in resistance or be opened. However, since the strain of less than about 1% is generated in the connecting rods according to at least one embodiment, strain of less than about 1% is also generated in the connecting line formed on the connecting rod. Thus, the crack can be prevented from forming in the connecting line even when the stretchable device 101 is stretched.

In particular, when the strain is generated in a longitudinal direction of the line, there is a high possibility that the crack is generated in the line when compared to when the strain is generated in a width direction of the line. As illustrated in FIG. 4, the longitudinal strain can be rarely generated in the first connecting areas 146c and 146d of the third and fourth pixel substrates 101c and 101d, and strain in a width direction having a relatively low value can be generated in the first connecting areas 146c and 146d of the third and fourth pixel substrates 101c and 101d. Thus, there is a low possibility that the crack is generated in the first connecting lines 135c and 135d.

To summarize the above descriptions, the first and second sides 111 and 113 are parallel to the first and second directions DR1 and DR2 that are not parallel to the third and fourth directions DR3 and DR4 in which the first to fourth pixels substrates 101a to 101d are arranged. Also, the flexible hinges extend from the first and second sides 111 and 113 respectively extend from the first and second sides 111 and 113 in the third and fourth directions DR3 and DR4. Thus, when the stretchable device 101 is stretched, the islands 110a to 110d rotate.

Accordingly, the strain generated in the flexible hinge can be reduced to prevent the crack from being generated in the lines formed on the flexible hinge. As a result, the stretchable device 101 can be further easily stretched.

Also, since each of the first and second connecting rods has a rod shape that is not bent, the strain is not concentrated on a specific portion of the first connecting rod. On the contrary, when the first connecting rod has a bent shape like that according to the related art, the strain can be concentrated on the bent portion, and there is a high possibility that a crack is generated in the line formed on the portion in which the strain is concentrated.

Figure 6:
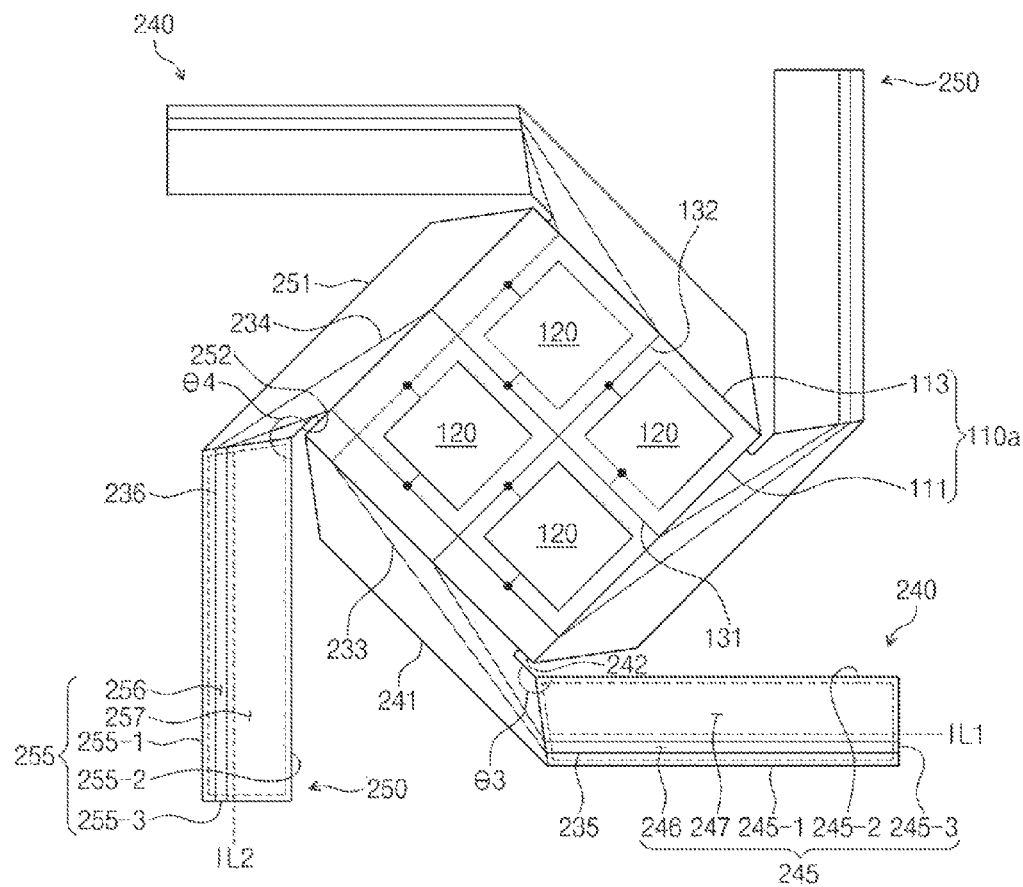
FIG. 6 is a plan view of a pixel substrate according to another embodiment.

FIG. 6 is a plan view of a pixel substrate according to another embodiment.

A first pixel substrate 201a of FIG. 6 includes an island 110a and a flexible hinge. Since the island 110a of the first pixel substrate 201a and the components formed thereon are the same as the island 110a of the first pixel substrate 101a and the components formed thereon of FIG. 1, repeated descriptions thereof will be omitted.

Also, as described later, the first pixel substrate 201a can further include first fan-out lines 233, second fan-out lines 234, first connecting lines 235, and second connecting lines 236.

The flexible hinge includes a plurality of first flexible sub-hinges 240 and a plurality of second flexible sub-hinges 250. In an embodiment, the number of first flexible sub-hinges 240 is two, and the first flexible sub-hinges 240 respectively correspond to the two second sides 113. Similarly, the number of second flexible sub-hinges 250 is two, and the second flexible sub-hinges 250 respectively correspond to the two first sides 111.

Each of the first flexible sub-hinges 240 includes a first fan-out part 241 and a first connecting rod 245. The first fan-out part 241 and the first connecting rod 245 can be formed of polymer such as polyethylene terephthalate similar to the island 110a.

The first fan-out part 241 is interposed between the first connecting rod 245 and the island 110a. In FIG. 6, the island 110a, the first fan-out part 241, and the first connecting rod 25 are separately provided. However, the described technology is not limited thereto, and the first fan-out part 241 can extend from the island 110a, and the first connecting rod 245 can extend from the first fan-out part 241.

The first fan-out lines 233 are formed on the first fan-out part 241. Each of the first fan-out lines 233 has one end that is electrically connected to one end of each of the second island lines 132. The distances between the first fan-out lines 233 gradually decrease from one end of the first fan-out lines 233 toward the other end of the first fan-out lines 233.

The first connecting rod 245 has a rod shape extending in one direction. More particularly, the first connecting rod 245 has a shape that is not bent. As described later, since the first connecting rod 245 has a rod shape, a phenomenon in which a large strain is generated in a longitudinal direction of the first connecting rod 245 can be prevented.

The first connecting rod 245 extends from the first fan-out part 241 in the direction parallel to the third direction DR3.

The first connecting rod 245 can include first and second connecting areas 246 and 247. The first and second connecting areas 246 and 247 divide the first connecting rod 245 in the fourth direction DR4. The second connecting area 247 is defined between the first center line (not shown) and the first connecting area 246.

The first connecting rod 245 includes a first edge 245-1, a second edge 245-2, and a first connection edge 245-3. The first and second edges 245-1 and 245-2 can extend in a direction parallel to the third direction DR3 to face each other. The first connection edge 245-3 can connect the first edge 245-1 to the second edge 245-2. Also, the first connection edge 245-3 cam extend in the fourth direction DR4 perpendicular to the third direction DR3.

The first and second edges 245-1 and 245-2 respectively belong to the first and second connecting areas 246 and 247. Also, an area between the first virtual line IL1 and the first edge 245-1 corresponds to the first connecting area 246. Further, an area between the first virtual line IL1 and the second edge 245-2 corresponds to the second connecting area 247.

The first connecting rod 245 forms a third angle θ3 with a corresponding second side 113. More particularly, the third angle θ3 can be defined as an angle formed by the second side 113 and the second edge 245-1. In an embodiment, the third angle θ3 can be about 225°.

The first connecting lines 235 are formed on the first connecting rod 245. The first connecting lines 235 are parallel to the third direction DR3 and arranged to be spaced a predetermined distance apart from each other in the fourth direction DR4. Each of the first connecting lines 235 has one end that is electrically connected to an end of each of the first fan-out lines 233.

In an embodiment, the first connecting lines 235 are formed only on the first connecting area 246. As described later, the first connecting rod 245 is bent, the strain generated in the first connecting area 246 is less than that generated in the second connecting area 247.

The first fan-out part 241 includes a first strain alleviating groove 242. The first strain alleviating groove 242 can be recessed in a direction parallel to the second side 113. In other words, the first strain alleviating groove 242 is recessed in a direction parallel to the second direction DR2. The first strain alleviating groove 242 is connected to the second edge 245-2. When the first connecting rod 245 is bent, the first strain alleviating groove 242 can reduce strain generated in the first connecting rod 245.

Each of the second flexible sub-hinges 250 includes a second fan-out part 251 and a second connecting rod 255. The second fan-out part 251 and the second connecting rod 255 can be formed of polymer such as polyethylene terephthalate similar to the island 110a.

The second fan-out part 251 is interposed between the second connecting rod 255 and the island 110a. In FIG. 6, the island 110a, the second fan-out part 251, and the second connecting rod 255 are separately provided. However, the described technology is not limited thereto, and the second fan-out part 251 can extend from the island 110a, and the second connecting rod 255 can extend from the second fan-out part 251.

The second fan-out lines 234 are formed on the second fan-out part 251. Each of the second fan-out lines 234 has one end that is electrically connected to the one end of each of the first island lines 131. The distances between the second fan-out lines 234 gradually decrease from one end of the second fan-out lines 234 toward the other end of the second fan-out lines 234.

The second connecting rod 255 has a rod shape extending in one direction. More particularly, the second connecting rod 255 has a shape that is not bent. As described later, since the second connecting rod 255 has a rod shape, a phenomenon in which a large strain is generated in a longitudinal direction of the second connecting rod 255 can be prevented.

The second connecting rod 255 extends from the second fan-out part 251 in the direction parallel to the fourth direction DR4.

The second connecting rod 255 includes a third edge 255-1, a fourth edge 255-2, and a second connection edge 255-3. The third and fourth edges 255-1 and 255-2 can extend in a direction parallel to the fourth direction DR4 to face each other. The second connection edge 255-3 can connect the third edge 255-1 to the fourth edge 255-2 and extend in the direction parallel to the third direction DR3.

The second connecting rod 255 forms a fourth angle θ4 with a first side 111, which corresponds thereto, of the first sides 111. More particularly, the fourth angle θ4 can be defined as an angle formed by the first side 111 and the fourth edge 255-1. In an embodiment, the fourth angle θ4 can be about 225°

The second connecting rod 255 can include third and fourth connecting areas 256 and 257. The third and fourth connecting areas 256 and 257 divide the second connecting rod 255 in the third direction DR3. More particularly, an area between the second virtual line IL2 and the third edge 255-1 corresponds to the third connecting area 156. Also, an area between the second virtual line IL2 and the fourth edge 255-2 corresponds to the fourth connecting area 257.

The second connecting lines 236 are formed on the second connecting rod 255. The second connecting lines 236 are parallel to the fourth direction DR4 and arranged to be spaced a predetermined distance apart from each other in the third direction DR3. Each of the second connecting lines 236 has one end that is electrically connected to the other end of each of the second fan-out lines 234.

In an embodiment, the second connecting lines 236 are formed only on the third connecting area 256. As described later, the second connecting rod 255 is bent, strain generated in the third connecting area 256 is less than that generated in the fourth connecting area 257.

The second fan-out part 251 includes a second strain alleviating groove 252. The second strain alleviating groove 252 can be recessed in the direction parallel to the first side 111. In other words, the second strain alleviating groove 252 is recessed in the direction parallel to the first direction DR1. The second strain alleviating groove 252 is connected to the fourth edge 255-2. When the second connecting rod 255 is bent, the second strain alleviating groove 252 can reduce the strain generated in the second connecting rod 255.

Figure 7:
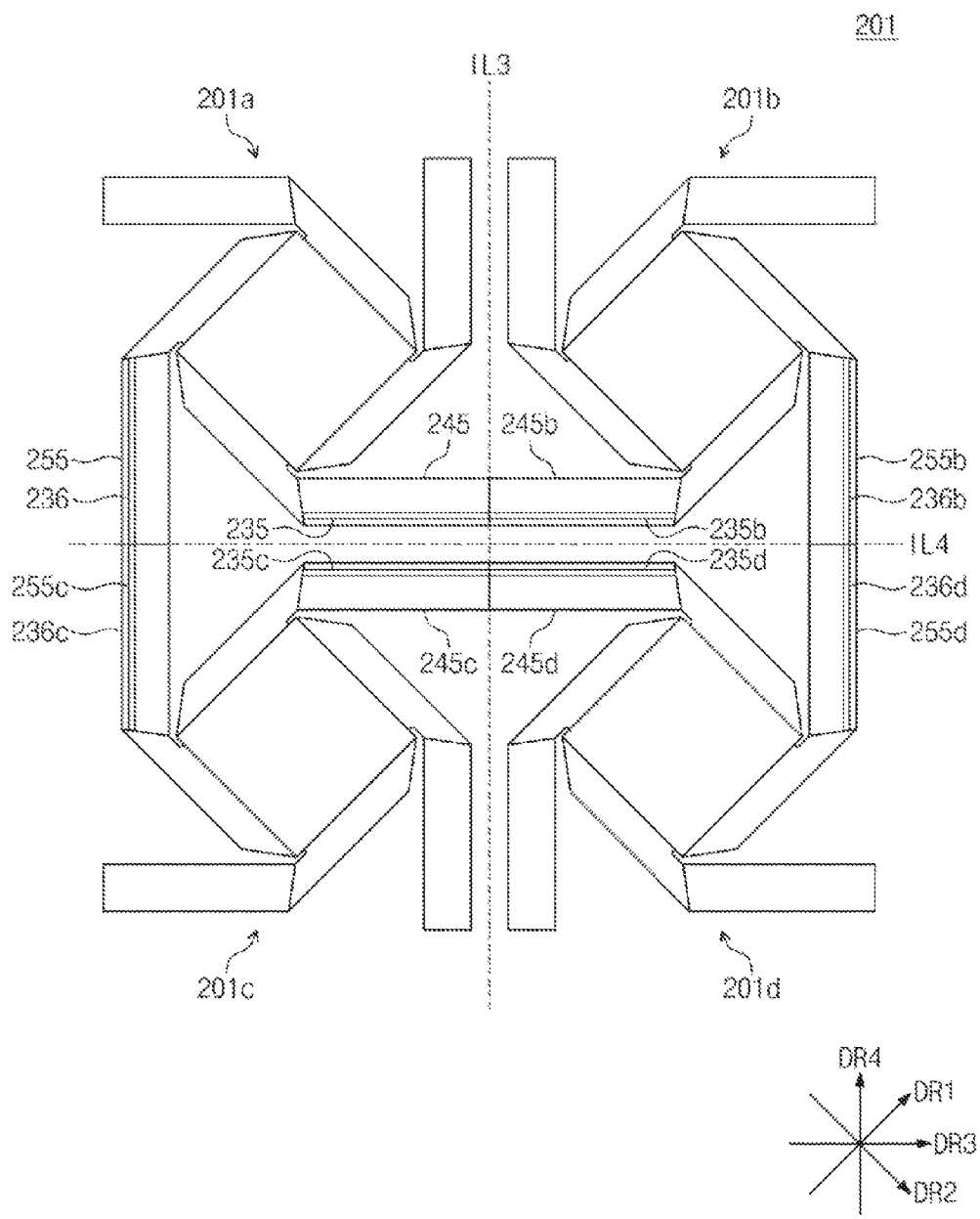
FIG. 7 is a plan view of a stretchable device according to another embodiment.

FIG. 7 is a plan view of a stretchable device according to another embodiment.

Referring to FIG. 7, the stretchable device 201 includes the first pixel substrate 201a and second to fourth pixel substrates 201b to 201d. The first to fourth pixel substrates 201a to 201d can form one pixel substrate unit. In FIG. 7, for convenience of description, a portion of components are omitted.

The first to fourth pixel substrates 201a to 201d are arranged in a matrix in the third and fourth directions DR3 and DR4. In FIG. 7, although the stretchable device 201 includes one pixel substrate unit, the stretchable device 201 can include a plurality of pixel substrate units connected to each other.

The second pixel substrate 201b is formed by symmetrically transforming the first pixel substrate 201a with respect to the third virtual line IL3. Thus, the second pixel substrate 201b can include the same components as those of the first pixel substrate 201a, that is, the island 110a, the flexible hinge, and the lines 231 to 236. The second pixel substrate 201b and the first pixel substrate 201a can have symmetric shapes with respect to the third virtual line IL3.

Also, the third pixel substrate 201c is provided by symmetrically transforming the first pixel substrate 201a with respect to the fourth virtual line IL4. Thus, the third pixel substrate 201c can include the same components as those of the first pixel substrate 201a, that is, the island 110a, the flexible hinge, and the lines 231 to 236. The third pixel substrate 201c and the first pixel substrate 201a can have symmetric shapes with respect to the fourth virtual line IL4.

Also, the fourth pixel substrate 201d is formed by symmetrically transforming the third pixel substrate 201c with respect to the third virtual line IL3. Thus, the fourth pixel substrate 201d can include the same components as those of the first pixel substrate 201a, that is, the island 110a, the flexible hinge, and the lines 231 to 236. The fourth pixel substrate 201d and the third pixel substrate 201c can have symmetric shapes with respect to the third virtual line IL3.

The flexible hinges of the first to fourth pixel substrates 201a to 201d contact each other and are connected to each other. More particularly, the first and second connecting rods 245 and 255 of the first pixel substrate 201a are respectively connected to a first connecting rod 245b of the second pixel substrate 201b and a second connecting rod 255c of the third pixel substrate 201c. Similarly, first and second connecting rods 245d and 255d of the fourth pixel substrate 201d are respectively connected to a first connecting rod 245c of the third pixel substrate 201c and a second connecting rod 255b of the second pixel substrate 201b.

The connecting lines of the first to fourth pixel substrates 201a to 201d contact each other and are connected to each other. More particularly, the first and second connecting lines 235 and 236 of the first pixel substrate 201a are connected to a first connecting line 235b of the second pixel substrate 201b and a second connecting line 236c of the third pixel substrate 201c. Similarly, first and second connecting lines 235d and 236d of the fourth pixel substrate 201d are respectively connected to a first connecting line 235c of the third pixel substrate 201c and a second connecting line 236b of the second pixel substrate 201b.

Like this, when the lines of the first to fourth pixel substrates 201a to 201d are connected to each other, light emitting devices (not shown) of the first to fourth pixel substrates 201a to 201d can be driven via gate signals and data signals.

Figure 8:
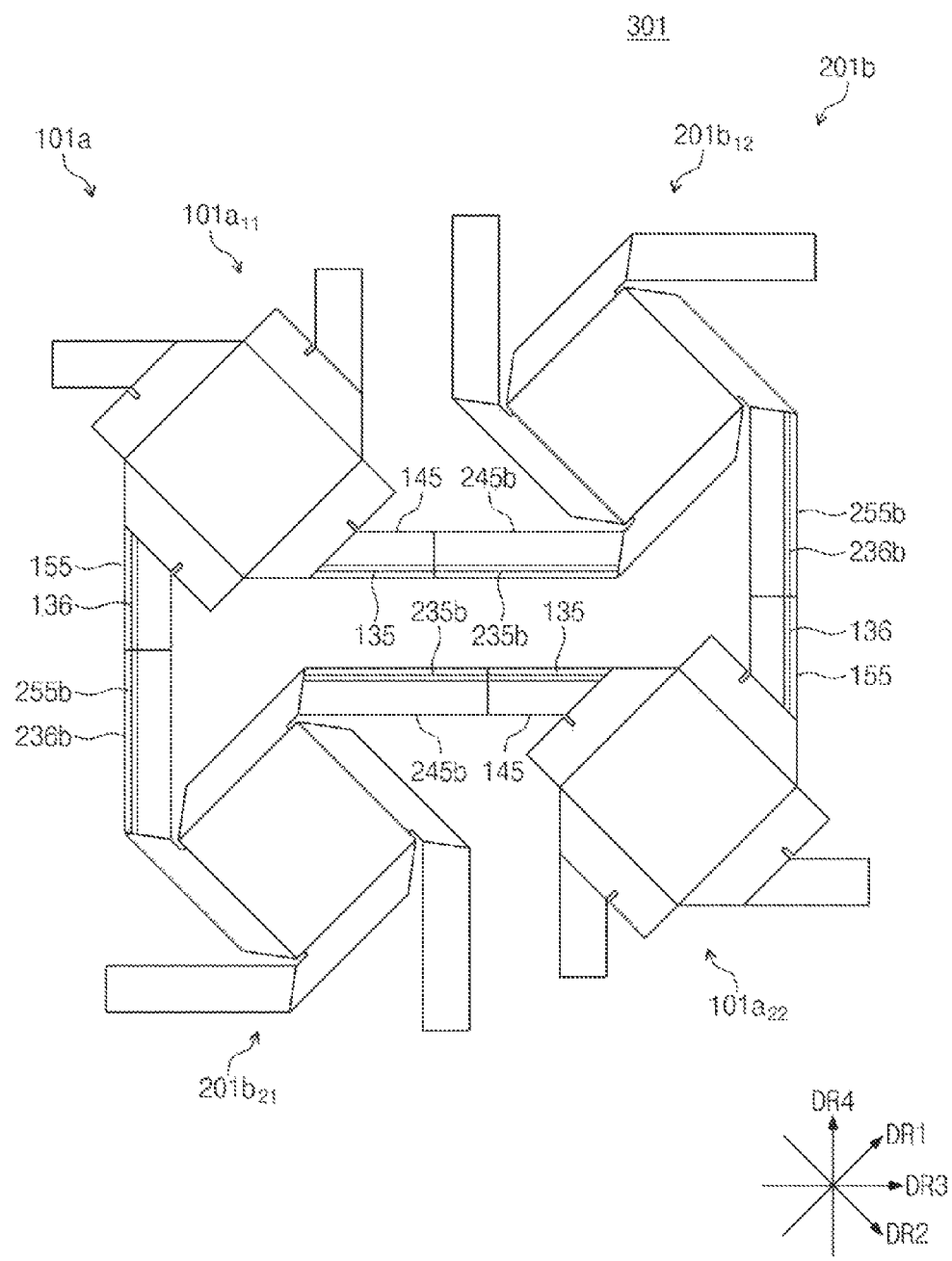
FIG. 8 is a plan view of a stretchable device according to yet another embodiment.

FIG. 8 is a plan view of a stretchable device according to yet another embodiment.

Referring to FIG. 8, the stretchable device 301 includes two first pixel substrate 101a and two second pixel substrates 201b. The first and second pixel substrates 101a and 201b can form one pixel substrate unit. In FIG. 8, for convenience of description, a portion of the components are omitted.

The first and second pixel substrates 101a and 201b are arranged in a matrix in the third and fourth directions DR3 and DR4. More particularly, the first pixel substrates 101a are arranged on coordinates of (1, 1) and (2, 2), and the second pixel substrates 201b are arranged on coordinates of (1, 2) and (2, 1). Hereinafter, for convenience of description, the first pixel substrates 101a arranged on the coordinates of (1, 1) and (2, 2) are respectively referred to as first pixel substrate $101a_{11}$ and a first pixel substrate $101a_{22}$. Also, the second pixel substrates 201b arranged on the coordinates of (1, 2) and (2, 1) are respectively referred to as second pixel substrate $201b_{12}$ and second pixel substrate $201b_{21}$.

In FIG. 8, although the stretchable device 301 is provided with one pixel substrate unit, the stretchable device 301 can be a provided with a plurality of pixel substrate units connected to each other.

The flexible hinges of the first and second pixel substrates contact each other and are connected to each other. More particularly, the first and second connecting rods 145 and 155 of the first pixel substrate $101a_{11}$ are respectively connected to a first connecting rod 245b of the second pixel substrate $201a_{12}$ and a second connecting rod 255b of the second pixel substrate $201b_{21}$. Similarly, first and second connecting rods 145 and 155 of the first pixel substrate $101a_{22}$ are respectively connected to a first connecting rod 245b of the second pixel substrate $201b_{21}$ and a second connecting rod 255b of the second pixel substrate $201b_{12}$.

The connecting lines of the first and second pixel substrates contact each other and are connected to each other. More particularly, the first and second connecting lines 135 and 136 of the first pixel substrate $101a_{11}$ are respectively connected to a first connecting line 235b of the second pixel substrate $201b_{21}$ and a second connecting line 236b of the second pixel substrate $201b_{21}$. Similarly, first and second connecting lines 135 and 136 of the first pixel substrate $101a_{22}$ are respectively connected to a first connecting line 235b of the second pixel substrate $201b_{21}$ and a second connecting line 236b of the second pixel substrate $201b_{12}$.

Like this, when the connecting lines of the first and second pixel substrates $101a_{11}$, $101a_{22}$, $201n_{12}$, $201b_{21}$ are connected to each other, light emitting devices (not shown) of the first and second pixel substrates $101a_{11}$, $101a_{22}$, $201n_{12}$, $201b_{21}$ can be driven via gate signals and data signals.

Figure 9:
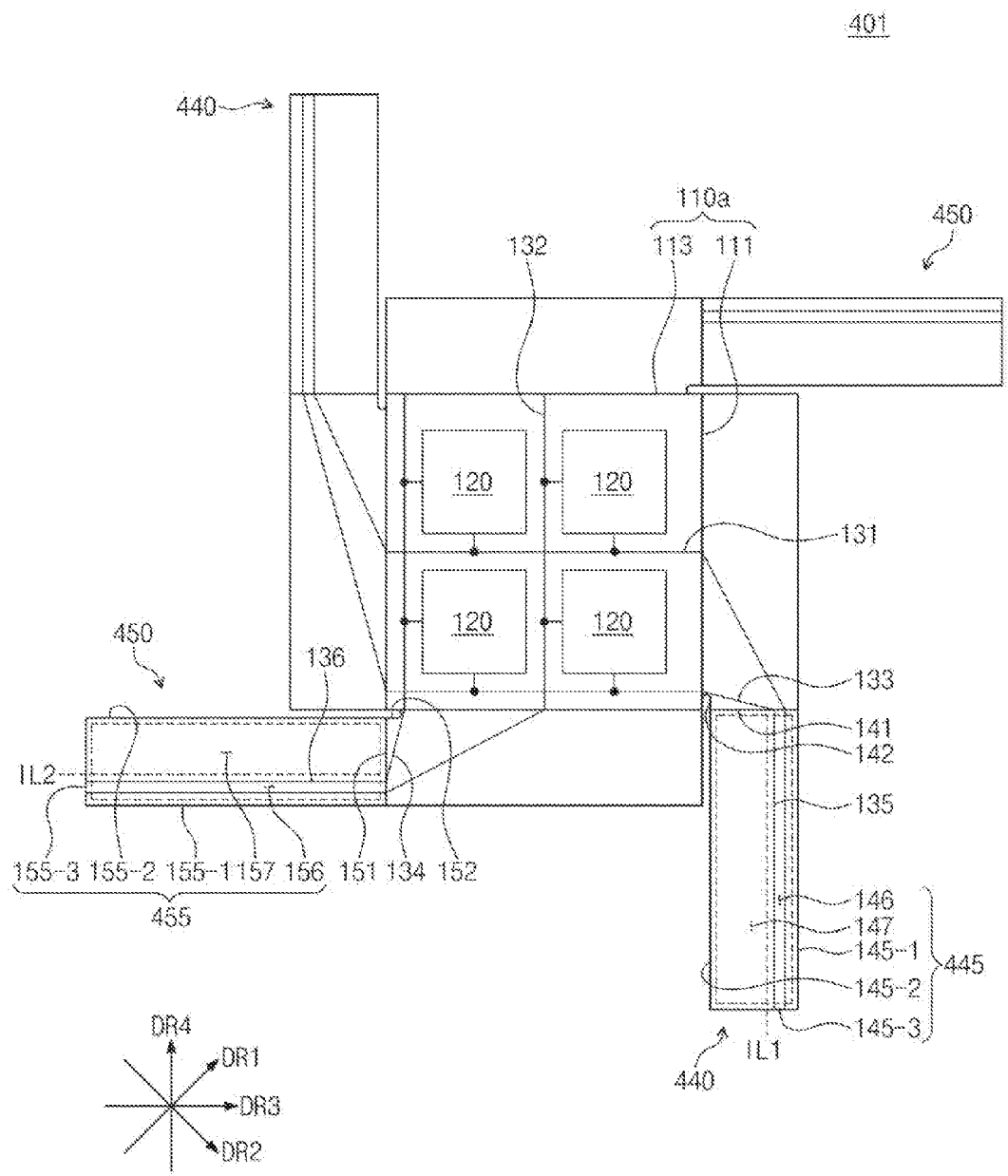
FIG. 9 is a plan view of a pixel substrate according to another embodiment.

FIG. 9 is a plan view of a pixel substrate according to another embodiment.

A first pixel substrate 401 of FIG. 9 includes the island 110a and the first and second flexible hinges 440 and 450. Since the island 110a and components formed thereon are the same as the island 110a and the components formed thereon of the first pixel substrate 101a, repeated descriptions will be omitted.

Also, the first flexible hinges 440 are the same as those 140 of FIG. 1 except for that the first flexible hinges 440 include a first connecting rod 445 instead of the first connecting rod 145.

The first connecting rod 445 forms a fifth angle (not shown) with a corresponding first side 111. More particularly, the fifth angle can be defined as an angle formed by the first side 111 and the first edge 145-1. In an embodiment, the fifth angle can be about 180°. The first connecting rod 445 has a shape extending parallel with the first side 111.

The second flexible hinges 450 are the same as those 150 of FIG. 1 except for that the second flexible hinges 450 include a second connecting rod 455 instead of the second connecting rod 155.

The second connecting rod 455 forms a sixth angle (not shown) with a corresponding second side 113. More particularly, the sixth angle can be defined as an angle formed by the second side 113 and the third edge 155-1. In an embodiment, the sixth angle can be about 180°. The second connecting rod 455 has a shape extending parallel with the second side 111.

In the stretchable device according to at least one embodiment, since the island of each of the pixel substrates includes sides that are not to the row and column directions, as the stretchable device is stretched, the island of the pixel substrate rotates. Also, each of the connecting rods of the flexible hinge has the rod shape that is not bent. Thus, the stress generated in the flexible hinge when the stretchable device is stretched and contracted can be reduced, as a result, crack can be prevented from being generated in the connecting lines formed on the flexible hinge.

The above-disclosed subject matter is to be considered illustrative and not restrictive, and the appended claims are intended to cover all such modifications, enhancements, and other embodiments, which fall within the true spirit and scope of the inventive technology. Thus, to the maximum extent allowed by law, the scope of the inventive technology is to be determined by the broadest permissible interpretation of the following claims and their equivalents, and shall not be restricted or limited by the foregoing detailed description.

What is claimed is:

1. A stretchable display, comprising:
a plurality of pixel substrates arranged in a matrix having row and column directions,
wherein each of the pixel substrates comprises an island and a flexible hinge connecting the island to at least one of the adjacent pixel substrates,
wherein the island of each of the pixel substrates comprises a plurality of first sides and a plurality of second sides, wherein each of the first and second sides is not parallel to the row and column directions, and
wherein the flexible hinge of each of the pixel substrates comprises:
a plurality of first flexible sub-hinges respectively extending from the first sides in the row direction; and
a plurality of second flexible sub-hinges respectively extending from the second sides in the column direction.

2. The stretchable display of claim 1, wherein the pixel substrate comprises:
a first island line formed over the island parallel with the second sides; and
a second island line formed over the island parallel with the first sides,
wherein the first island line has a first end that overlaps a corresponding one of the first sides, and
the second island line has a first end that overlaps a corresponding one of the second sides.

3. The stretchable display of claim 2, wherein each of the first flexible sub-hinges comprises a first connecting rod parallel to the row direction and having a shape which is not bent,
wherein each of the second flexible sub-hinges comprises a second connecting rod parallel to the column direction and having a shape which is not bent, and
wherein each of the pixel substrates further comprises:
a first connecting line connected to the first island line and formed on the first connecting rod; and
a second connecting line connected to the second island line and formed on the second connecting rod.

4. The stretchable display of claim 3, wherein each of the first flexible sub-hinges comprises a first fan-out portion interposed between the corresponding first connecting rod and the island,
wherein each of the second flexible sub-hinges comprises a second fan-out portion interposed between the corresponding second connecting rod and the island, and
wherein each of the pixel substrates further comprises:
a first fan-out line connecting the first connecting line to the first island line and formed on the first fan-out part; and
a second fan-out line connecting the second connecting line to the second island line and formed on the second fan-out part.

5. The stretchable display of claim 4, wherein each of the first connecting rods is divided into first and second connecting areas in the column direction, and wherein the first connecting line is formed only on the first connecting area.

6. The stretchable display of claim 5, wherein when the stretchable display is stretched, strain in the first connecting area is less than that in the second connecting area.

7. The stretchable display of claim 6, wherein the second connecting area is defined between a first center line and the first connecting area, and wherein the first center line passes through a center of the island and is parallel with the row direction.

8. The stretchable display of claim 7, wherein the first connecting rod comprises first and second edges respectively belonging to the first and second connected areas, and wherein the first fan-out portion comprises a strain alleviating groove connected to the second edge and configured to alleviate stress in the first connecting rod.

9. The stretchable display of claim 8, wherein the strain alleviating groove is recessed parallel with the second side.

10. The stretchable display of claim 5, wherein each of the second connecting rods is divided into third and fourth connecting areas in the row direction, and wherein the second connecting line is formed only on the third connecting area.

11. The stretchable display of claim 10, wherein when the stretchable display is stretched, strain in the third connecting area is less than that in the fourth connecting area.

12. The stretchable display of claim 11, wherein the fourth connecting area is defined between a second center line and the third connecting area, and wherein the second center line passes through a center of the island and is parallel with the column direction.

13. The stretchable display of claim 12, wherein when the stretchable display is bent, a strain value of each of the first and third connecting area is less than about 1%.

14. The stretchable display of claim 3, wherein an angle formed between the first side and the first connecting rod is about 45°, and wherein an angle formed between the second side and the second connecting rod is about 225°.

15. The stretchable display of claim 2, further comprising at least one light emitting element formed on the island of the pixel substrate.

16. The stretchable display of claim 15, wherein the at least one light emitting element is connected to the first island line and the second island line.

17. The stretchable display of claim 1, wherein the pixel substrates comprises first and second pixel substrates alternately arranged in the row and column directions,
wherein an angle formed between a first side of the first pixel substrate and first connecting rod of each of the first flexible sub-hinges of the first pixel substrate and an angle formed between a second side of the first pixel substrate and second connecting rod of each of the second flexible sub-hinges of the first pixel substrate are defined as a first angle, and
wherein an angle formed between a first side of the second pixel substrate and the first connecting rod of the first flexible sub-hinge of the second pixel substrate and an angle formed between a second side of the second pixel substrate and the second connecting rod of the second flexible sub-hinge of the second pixel substrate are defined as a second angle that is different from the first angle.

18. The stretchable display of claim 17, wherein the first angle is about 45°, and wherein the second angle is about 225°.

19. The stretchable display of claim 1, wherein the pixel substrates comprises first to third pixel substrates,
wherein the second pixel substrate and the first pixel substrate have symmetric shapes with respect to a first virtual line passing between the first and second pixel substrates parallel with the column direction, and
wherein the third pixel substrate and the first pixel substrate have symmetric shapes with respect to a second virtual line passing between the first and third pixel substrates parallel with the row direction.

20. A stretchable display, comprising:

a plurality of pixel substrates arranged in a matrix having row and column directions, wherein each of the pixel substrates comprises an island and a flexible hinge connecting the island to at least one of the adjacent pixel substrates, wherein the island of each of the pixel substrates comprises a plurality of first sides and a plurality of second sides respectively parallel to the row and column directions, and wherein the flexible hinge of each of the pixel substrates comprises:
- a plurality of first flexible sub-hinges respectively extending from the first sides in the row direction; and
- a plurality of second flexible sub-hinges respectively extending from the second sides in the column direction.

* * * * *